United States Patent
Gammel et al.

(10) Patent No.: US 6,891,173 B2
(45) Date of Patent: May 10, 2005

(54) ION IMPLANTATION SYSTEMS AND METHODS UTILIZING A DOWNSTREAM GAS SOURCE

(75) Inventors: George Gammel, Marblehead, MA (US); Paul Allan Daniel, Kittery Point, ME (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 210 days.

(21) Appl. No.: 10/005,592

(22) Filed: Oct. 26, 2001

(65) Prior Publication Data

US 2003/0080301 A1 May 1, 2003

(51) Int. Cl.⁷ .............................................. H01J 37/317
(52) U.S. Cl. .................... 250/492.21; 250/251
(58) Field of Search ........................ 250/492.21, 251

(56) References Cited

U.S. PATENT DOCUMENTS

| | | | |
|---|---|---|---|
| 4,234,797 A | 11/1980 | Ryding | |
| 4,361,762 A | 11/1982 | Douglas | |
| 4,463,255 A | 7/1984 | Robertson et al. | |
| 4,587,433 A | 5/1986 | Farley | |
| 4,595,837 A | 6/1986 | Wu et al. | |
| 4,786,814 A | 11/1988 | Kolondra et al. | |
| 4,847,504 A * | 7/1989 | Aitken | 250/492.2 |
| 5,136,171 A | 8/1992 | Leung et al. | |
| 5,354,381 A | 10/1994 | Sheng | |
| 5,399,871 A | 3/1995 | Ito et al. | |
| 5,572,038 A | 11/1996 | Sheng et al. | |
| 5,814,819 A * | 9/1998 | Sinclair et al. | 250/492.21 |
| 5,814,823 A | 9/1998 | Benveniste | |
| 5,962,858 A | 10/1999 | Gwinn | |
| 6,130,436 A | 10/2000 | Renau et al. | |
| 6,573,510 B1 * | 6/2003 | Vella | 250/251 |

FOREIGN PATENT DOCUMENTS

| | | |
|---|---|---|
| TW | 385495 | 3/2000 |
| WO | WO 99/03125 | 1/1999 |

OTHER PUBLICATIONS

Curello, G. et al., "Charge Exchange in Eaton's NV–8250 Medium Current Ion Implantar," 1998 International Conference On Ion Implantation Technology Proceedings (Cat. No. 98EX144), Kyoto, Japan, Jun. 22–26, 1998 pp. 543–545, vol. 1, XP00224112, Piscataway, NJ, USA, IEEE, USA; ISBN 0–7803–4538–X.

* cited by examiner

Primary Examiner—Jack I. Berman

(57) ABSTRACT

Systems and methods that neutralize ion beams in implantation processes are provided. The methods involve introducing a gas into the ion beam. The gas, for example, can be introduced into a region defined by an electrode through which the ion beam travels. The gas increases the generation of electrons in the beam which, in turn, neutralizes the beam. The neutralized beam has a reduced tendency to diverge (i.e., greater beam stability) during transport which can increase the beam current delivered to the wafer and implant uniformity, amongst other advantages. The systems and methods are particularly useful in limiting the divergence of low energy ion beams.

31 Claims, 2 Drawing Sheets

ION IMPLANTATION SYSTEMS AND METHODS UTILIZING A DOWNSTREAM GAS SOURCE

FIELD OF INVENTION

The invention relates generally to ion implantation and, more particularly, to ion implantation systems and methods that introduce gas into an ion beam.

BACKGROUND OF INVENTION

Semiconductor materials, in the form of wafers, are used extensively as substrates in electronic applications. Typically, semiconductor wafers are processed using conventional techniques to form semiconductor devices. Ion implantation is one conventional technique for introducing dopants into semiconductor wafers. Dopants may be implanted into a semiconductor to form regions of desired conductivity. Such implanted regions can form active regions in the resulting semiconductor devices.

Typically, during ion implantation, a dopant gas is ionized in an ion source to form positive ions and electrons. The positive ions are accelerated at a selected energy to form an ion beam. The beam is directed at the surface of the wafer and the impinging ions penetrate into the bulk semiconductor material to form an implanted region having a desired conductivity.

In certain implantation processes, it is desirable to use an ion beam having a neutral space charge, that is, a beam in which the charge contribution from positive ions is substantially equally to the charge contribution from electrons. Beams that do not have a substantially neutral space charge (i.e., beams that have either a positive or a negative space charge) may have a tendency to diverge, or expand. This divergence makes it difficult to transport such beams through the system to the wafer. Consequently, the beam current delivered to the wafer may be reduced, thereby increasing implant time. Furthermore, the uniformity of dopant implantation over the implant region can be limited. Also, non-neutral beams may lead to charge build up on the wafer surface which can damage or destroy the wafer.

In particular, generating an ion beam at low energies (e.g., less than 5 kV) having a neutral space charge may be challenging. Low energy beams are used, for example, in ion implantation processes that form doped regions having shallow depths. Typically, low energy beams have more positive ions than electrons, thus giving the beam a net positive charge. Also, low energy beams travel more slowly and, thus, have more time to diverge.

One conventional technique for neutralizing an ion beam involves increasing the flow of the dopant gas to be ionized within the ion source. However, such dopant gases (e.g., $BF_3$) are relatively expensive and, thus, such techniques can significantly increase the cost of the process. Also, increasing the dopant gas flow rate may require high arc currents within the source which can reduce the source lifetime. In some cases, increasing the dopant gas flow rate also leads to arcing within the extraction gap which can cause process instabilities.

Other known techniques involve the use of electron flood guns or plasma flood guns which introduce electrons into the beam to neutralize charge buildup on the semiconductor wafer. Typically, electrons are introduced into the beam in a region proximate the wafer to optimize charge neutralization on the wafer.

SUMMARY OF INVENTION

Ion implantation systems and methods that introduce a gas into the ion beam to neutralize the ion beam are provided.

In one aspect, the invention provides an ion implantation system. The ion implantation system includes an ion beam source capable of generating an ion beam and an electrode associated with the ion beam source and positioned so that the ion beam passes therethrough. The system further includes a gas supply constructed and arranged to introduce gas into a region defined, at least in part, by the electrode.

In another aspect, the invention provides an ion implantation system. The system includes an ion beam source capable of generating an ion beam, and a housing downstream of the ion beam source and positioned so that the ion beam passes therethrough. The system further includes a gas supply constructed and arranged to introduce gas into a region defined, at least in part, by the housing.

In another aspect, the invention provides an ion implantation system. The ion implantation system includes a dopant gas supply and an ion beam source connected to the dopant gas supply. The ion beam source is capable of generating an ion beam from the dopant gas. The system further includes an extraction electrode associated with the ion beam source and positioned so that the ion beam passes therethrough. The system further includes a secondary gas supply constructed and arranged to introduce gas comprising neutral species into a region defined, at least in part, by the extraction electrode.

In another aspect, the invention provides an ion implantation method. The method includes generating an ion beam using an ion beam source; and introducing a gas into the ion beam within a region defined, at least in part, by an electrode associated with the ion beam source and through which the ion beam passes.

Other aspects, features, and embodiments will be apparent from the following detailed description when considered in conjunction with the accompanying figures.

DETAILED DESCRIPTION

Systems and methods that neutralize ion beams in implantation processes are provided. The methods involve introducing a gas into the ion beam. The gas, for example, can be introduced into a region defined by an electrode through which the ion beam travels. As described further below, the gas increases the generation of electrons in the beam which, in turn, neutralizes the beam. The neutralized beam has a reduced tendency to diverge (i.e., greater beam stability) during transport which can increase the beam current delivered to the wafer and implant uniformity, amongst other advantages. The systems and methods are particularly useful in limiting the divergence of low energy ion beams.

Figure 1:
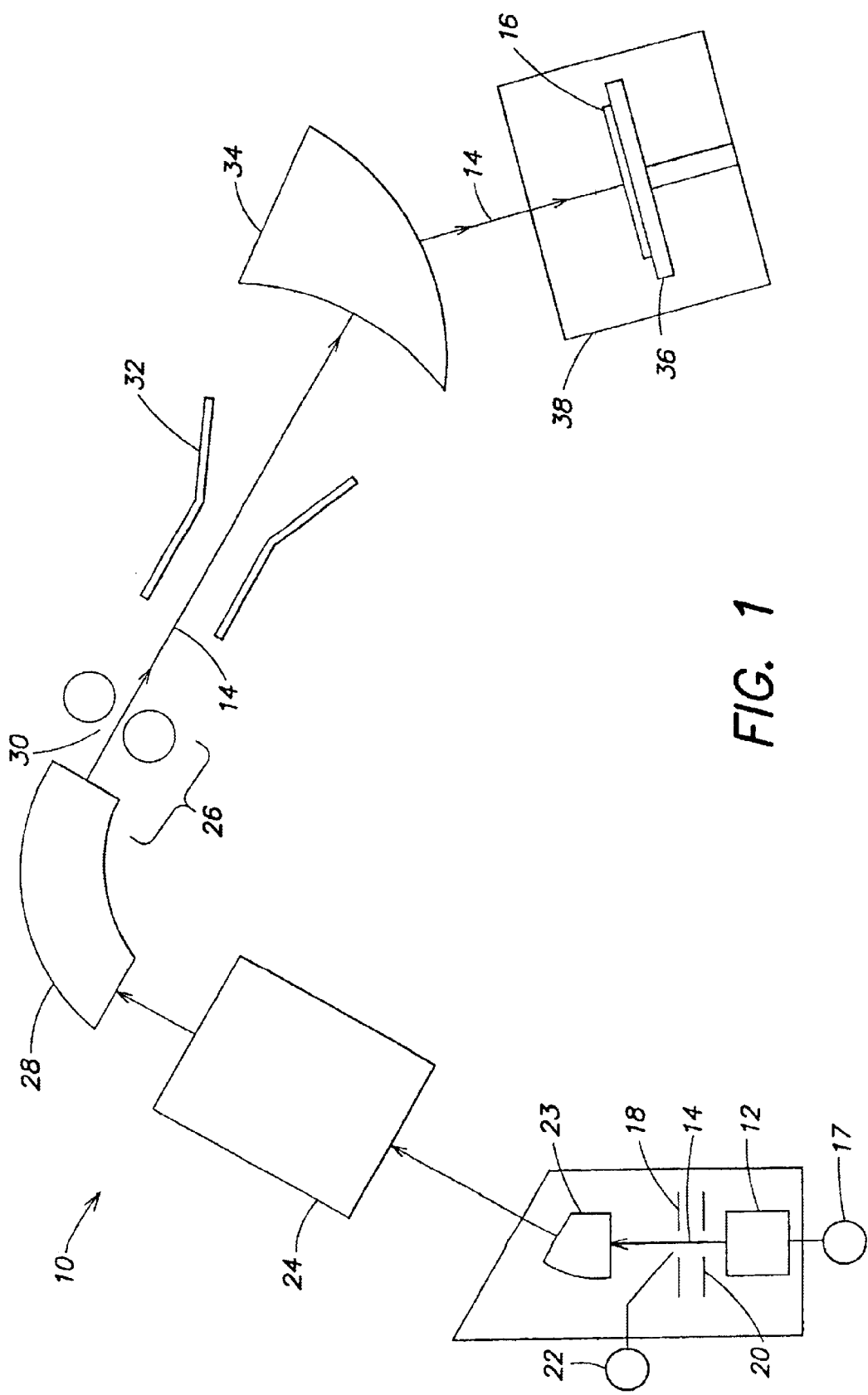
FIG. 1 illustrates an ion implantation system according to one embodiment of the invention.

FIG. 1 illustrates an ion implantation system 10 according to one embodiment of the invention. System 10 includes an ion beam source 12 that generates an ion beam 14 which is transported through the system and impinges upon a wafer 16. Ion beam source 12 is connected to a dopant gas supply 17. Dopant gas from supply 17 is introduced into the ion beam source 12 and is ionized to generate positive ions and electrons. An extraction electrode 18 is associated with ion beam source 12 for extracting the ion beam from the source. A suppression electrode 20 may also be associated with the source. Ion beam 14, typically, exits source 12 with a net positive charge due to the presence of more positive ions than electrons in the beam. The system further includes a secondary gas supply 22. As described further below, the secondary gas supply is arranged to introduce gas into the ion beam to neutralize the space charge of the beam. For example, the secondary gas may be introduced into a region defined, at least in part, by one of the electrodes associated with the source and through which the beam travels.

Implantation system 10 further includes a source filter 23 which removes undesired species from the beam. Downstream of source filter 23, the system includes an acceleration/deceleration column 24 in which the ions in the beam are accelerated/decelerated to a desired energy, and a mass analyzer 26 which removes energy and mass contaminants from ion beam 14 through the use of a dipole analyzing magnet 28 and a resolving aperture 30. A scanner 32, which may be an electrostatic scanner, is positioned downstream of the mass analyzer and is designed to scan the ion beam across wafer 16 as desired. The system includes an angle corrector magnet 34 to deflect ions in the scanned beam to produce a scanned beam having parallel ion trajectories. During implantation, the scanned beam impinges upon the surface of wafer 16 which is supported on a platen 36 within a process chamber 38. It should be understood that the entire path traversed by ion beam 14 is under vacuum during implantation. The implantation process is continued until regions having the desired dopant concentration and implant depth are formed within the wafer.

It should be understood that the systems and methods of the invention may be used in connection with any ion implantation system or method, and that a different ion implantation system than the one illustrated in FIG. 1 may be utilized. Accordingly, the system illustrated in FIG. 1 may be modified as desired for a particular process. In some cases, systems of the invention may include additional components than those illustrated. For example, the system may include an automated wafer handling system for introducing wafers into the process chamber prior to implantation and for removing wafers from the process chamber after implantation. In some cases, systems of the invention may not include all of the illustrated components. For example, the system may not include a scanner and/or the wafer itself may be translated to form implanted regions within the wafer.

As described above, the secondary gas from supply 22 introduced into ion beam 12 neutralizes the ion beam. That is, introduction of the secondary gas causes the space charge of the ion beam to become more neutral. The increased neutrality results from the generation of electrons in the beam. As described above, ion beam 14 typically exits source 12 with a net positive charge. When the secondary gas is introduced into the positive ion beam, atoms of the secondary gas collide with the ions within the beam. These collisions generate electrons and positive ions. However, it is observed that generally the electrons generated contribute more to the net charge of the beam than the positive ions generated. Thus, the net effect of the secondary gas introduction generally is to decrease the positive charge of the ion beam, causing it to become more neutral. It is believed that the majority of the positive ions generated in the collisions do not contribute to the charge of the beam, at least in part, because their low energies limit the extent to which they can be transported as part of the beam.

It should be understood that the systems and methods of the invention do not require that the secondary gas introduction produce an ion beam having an exactly (or even substantially) neutral space charge. For example, in some embodiments, the introduction of secondary gas produces an ion beam that still has a net positive charge. However, the charge of the beam is generally more neutral than the charge of the beam prior to the introduction of secondary gas. In some embodiments, the introduction of the secondary gas produces an ion beam having a substantially neutral space charge.

The increase in beam neutrality can reduce divergence of the beam during transportation through ion implantation system 10, thus providing a more stable beam that impinges upon wafer 16. The greater beam stability may result in more controllable and uniform implants. Advantageously, the systems and methods of the invention can generally increase beam stability without having to adjust operating conditions of beam source 12 in a manner that can sacrifice the performance of the source as is done in certain conventional processes for increasing beam stability. For example, beam stability can be achieved without increasing the flow rate of dopant gas to source 12 and/or increasing the arc current of the source, both of which limit source life and can increase beam instability.

The systems and methods of the present invention are capable of generating a stable beam even at relatively low ion beam energies. The systems and methods of the present invention may achieve a stable beam, for example, at beam energies of less than 10 keV, less than 5 keV, or even lower.

A variety of different secondary gases may be used in connection with the systems and methods of the invention. Generally, any secondary gas may be used that effectively neutralizes the ion beam and does not otherwise impair the implantation process, for example, by introducing contamination to the system. The secondary gas primarily comprises neutral atomic species such as atoms or molecules. For example, in some embodiments, greater than 75% of the total number of atomic species are neutral; and, in some embodiments, greater than 95%, or even greater than 99%, of the total number of atomic species are neutral. Typically, the secondary gas is relatively easily ionized so that electrons are readily generated from collisions between the secondary gas molecules and the ion beam. Suitable gases include dry nitrogen and inert gases such as argon or xenon. Other gases may also be used. It may be desirable to utilize a relatively inexpensive secondary gas so as to avoid significantly increasing the cost of the implantation process.

The secondary gas is introduced at a flow rate sufficient to provide the desired ion beam stability. Typically, the flow rate of secondary gas is less than about 2.5 cm$^3$ (STP)/min. In some cases, the flow rate is between about 1.0 cm$^3$ (STP)/min and about 2.0 cm$^3$ (STP)/min. However, other flow rates may also be used including flow rates of greater than about 2.5 cm$^3$ (STP)/min. The exact secondary gas flow rate depends upon process parameters such as beam current. Flow rate may be monitored, for example, using a mass flow controller (39, FIG. 2).

Figure 2:
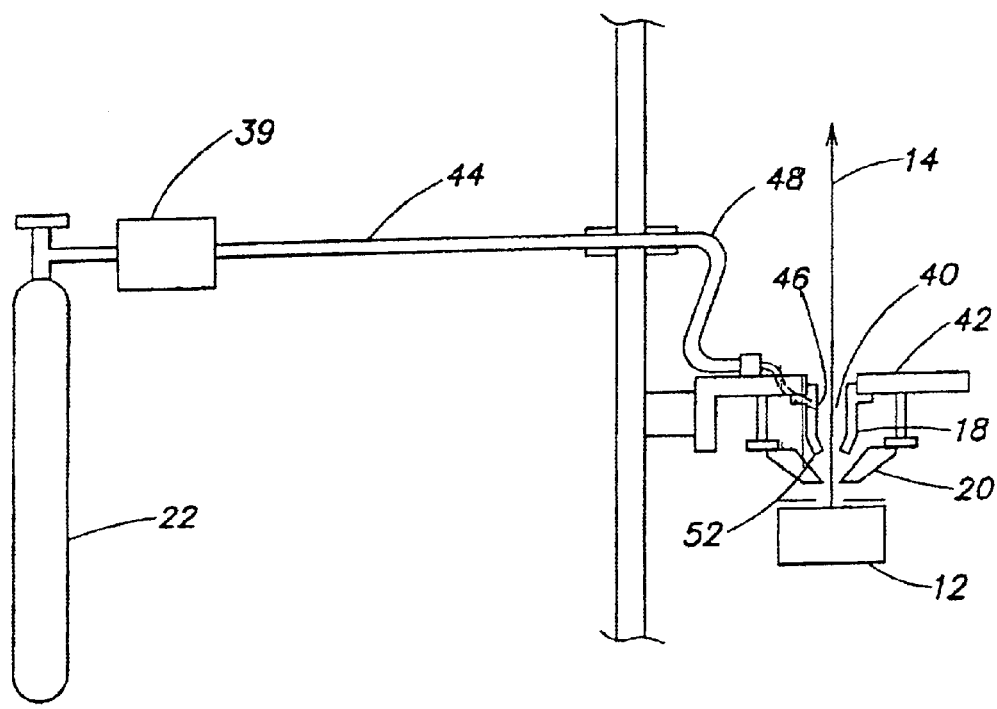
FIG. 2 illustrates one embodiment of the invention in which the secondary gas is introduced into a region defined by an extraction electrode.

In general, the introduction of the secondary gas can be provided in any location that effectively neutralizes the ion beam to the extent that it is transported with the desired stability. In some preferred embodiments, secondary gas introduction occurs relatively proximate to beam source 12. FIG. 2 schematically illustrates one embodiment of the invention in which the secondary gas is introduced into a region 40 defined by extraction electrode 18. Extraction electrode 18 may be grounded; or, in other cases, maintained at either a positive or a negative voltage. In the illustrative embodiment, extraction electrode 18 is secured to a manipulator assembly 42 which is movable relative to the beam, for example, to focus or tune the beam. The secondary gas flows from the secondary gas supply 22 into region 40 through a tube 44 connected to an inlet 46 formed in electrode 18. Tube 44 may include a flexible portion 48 that is bendable in response to movement by the manipulator assembly. A second electrode, for example a suppression electrode 20, may also be secured to the manipulator assembly, as shown.

In the illustrative embodiment, electrode 18 is cylindrically shaped and has an inwardly tapered end 52. The cylindrical shape and the tapered end can enhance confinement of the secondary gas within region 40 which, in some cases, improves beam neutralization. Electrode 18 may also have other shapes that enhance gas confinement. However, it should be understood that the design of electrode 18 depends at least in part upon other factors related to beam generation and transportation, and that the electrode may have a shape that does not enhance gas confinement.

Inlet 46 may be designed constructed and arranged to enhance confinement of the secondary gas introduced within region 40. For example, inlet 46 may be arranged so as to introduce secondary gas in an upstream direction (i.e., a direction opposite of beam transport) toward inwardly tapered end 52 as shown. Other inlet arrangements are also possible.

It should be understood that the secondary gas may be introduced into other regions within the system than shown in FIG. 2. For example, the secondary gas may be introduced into a region defined by another electrode (e.g., suppression electrode) associated with the ion beam source. In some embodiments, the secondary gas may be introduced into regions that are defined by a housing that is not connected to a voltage source and, thus, does not function as an electrode. As described above, the secondary gas is typically introduced into a region relatively proximate to the ion beam source so that the beam does not travel a significant distance or significantly diverge prior to secondary gas introduction. For example, the region may be upstream of acceleration/deceleration column 24 and/or upstream of dipole analyzing magnet 28.

Those skilled in the art would readily appreciate that all parameters listed herein are meant to be exemplary and that the actual parameters would depend upon the specific application for which the methods of the invention are used. It is, therefore, to be understood that the foregoing embodiments are presented by way of example only and that, within the scope of the appended claims and equivalents thereto the invention may be practiced otherwise than as specifically described.

What is claimed is:

1. An ion implantation system comprising:
an ion beam source capable of generating an ion beam;
a first dopant gas supply connected to the ion beam source for introducing a dopant gas to the ion beam;
an electrode associated with the ion beam source and positioned so that the ion beam passes therethrough; and
a second neutralizin gas supply constructed and arranged to introduce neutralizing as into a region defined, at least in part, by the electrode for neutralizing the space charge of the ion beam.

2. The system of claim 1, wherein the electrode comprises an extraction electrode.

3. The system of claim 1, wherein the electrode is grounded.

4. The system of claim 1, wherein the electrode is shaped to confine the neutralizing gas introduced into the region.

5. The system of claim 4, wherein the electrode includes an inwardly tapered end.

6. The system of claim 1, wherein a second electrode is secured to the manipulator assembly.

7. The system of claim 6, wherein a second electrode is secured to the manipulator assembly.

8. The system of claim 1, wherein an inlet to the region is formed in the electrode.

9. The system of claim 8, wherein the inlet is constructed and arranged to introduce gas into the region in an upstream direction.

10. The system of claim 1, further comprising a flow controlling device constructed and arranged to control the flow of the neutralizing gas from the second neutralizing gas supply.

11. The system of claim 1, wherein the flow rate of the neutralizing gas from the second neutralizing gas supply is less than about 2.5 $cm^3$ (STP)/min.

12. The system of claim 1, wherein the second neutralizing gas supply is constructed and arranged to introduce an inert gas into the region.

13. The system of claim 1, wherein the second neutralizing gas supply is constructed and arranged to introduce a gas selected from the group consisting of dry nitrogen, xenon and argon.

14. The system of claim 1, wherein the gas comprises neutral species.

15. An ion implantation system comprising:
an ion beam source capable of generating an ion beam;
a first dopant gas supply connected to the ion beam source for introducing a dopant gas to the ion beam;
a housing downstream of and proximate to the ion beam source and positioned so that the ion beam passes therethrough; and
a second neutralizing gas supply constructed and arranged to introduce neutralizing gas into a region defined, at least in part by the housing.

16. The ion implantation system of claim 15, wherein the housing comprises an electrode.

17. The ion implantation system of claim 15, wherein the housing is not connected to a voltage source.

18. The ion implantation system of claim 15, wherein the housing is upstream of an acceleration /deceleration column for accelerating and decelerating the ion beam to a desired energy.

19. An ion implantation system comprising:
a dopant gas supply;
an ion beam source connected to the dopant gas supply and capable of generating an ion beam from the dopant gas
an extraction electrode associated with the ion beam source and positioned so that the ion beam passes therethrough; and
a secondary gas supply constructed and arranged to introduce gas comprising neutral species into a region defined, at least in part, by the extraction electrode for neutralizing the space charge of the ion beam.

20. A method of generating an ion beam comprising:
generating an ion beam using an ion beam source;
introducing a dopant gas to the ion beam; and introducing a neutralizing gas into the ion beam within a region defined, at least in part, by an electrode associated with the ion beam source and through which the ion beam passes for neutralizing the space charge of the ion beam.

21. The method of claim 20, wherein introducing the neutralizing gas into the ion beam neutralizes the ion beam.

22. The method of claim 21, wherein the ion beam is neutralized to a substantially neutral space charge.

23. The method of claim 20, wherein the electrode comprises an extraction electrode.

24. The method of claim 20, wherein the electrode is grounded.

25. The method of claim 20, further comprising controlling the rate of introduction of the neutralizing gas into the ion beam.

26. The method of claim 25, wherein rate of introduction of the neutralizing gas into the ion beam is less than about 2.5 cm$^3$ (STP)/min.

27. The method of claim 20, further comprising accelerating the ion beam to an energy of less than about 10 keV.

28. The method of claim 27, further comprising accelerating the ion beam to an energy of less than about 5 keV.

29. The method of claim 20, wherein the neutralizing gas comprises an inert gas.

30. The method of claim 20, wherein the neutralizing gas comprises a gas selected from the group consisting of dry nitrogen, xenon and argon.

31. The method of claim 20, wherein the neutralizing gas comprises neutral species.

* * * * *